(12) United States Patent
Jang et al.

(10) Patent No.: US 9,325,481 B2
(45) Date of Patent: *Apr. 26, 2016

(54) METHOD FOR PERFORMING CHANNEL INTERLEAVING IN A MULTI-ANTENNA WIRELESS COMMUNICATION SYSTEM, AND APPARATUS FOR SAME

(71) Applicant: LG Electronics Inc., Seoul (KR)

(72) Inventors: Jiwoong Jang, Anyang-si (KR); Moonil Lee, Anyang-si (KR); Hyunwoo Lee, Anyang-si (KR); Jaehoon Chung, Anyang-si (KR); Seunghee Han, Anyang-si (KR); Hyunsoo Ko, Anyang-si (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/717,873

(22) Filed: May 20, 2015

(65) Prior Publication Data

US 2015/0256318 A1    Sep. 10, 2015

Related U.S. Application Data

(63) Continuation of application No. 14/523,568, filed on Oct. 24, 2014, now Pat. No. 9,065,622, which is a
(Continued)

(51) Int. Cl.
*H04L 12/701* (2013.01)
*H04L 12/721* (2013.01)
(Continued)

(52) U.S. Cl.
CPC .......... *H04L 5/0058* (2013.01); *H03M 13/6525* (2013.01); *H04L 1/0071* (2013.01); *H04L 1/0073* (2013.01); *H04L 1/0079* (2013.01); *H04L 1/1671* (2013.01);
(Continued)

(58) Field of Classification Search
CPC ....... H04L 45/00; H04L 45/12; H04L 45/245; H04L 47/125
USPC .................................................. 370/328, 329
See application file for complete search history.

(56) References Cited

U.S. PATENT DOCUMENTS

2008/0219370 A1   9/2008   Onggosanusi et al.
2009/0207784 A1   8/2009   Lee et al.
(Continued)

FOREIGN PATENT DOCUMENTS

CN      101695017 A      4/2010
CN      101702631 A      5/2010

*Primary Examiner* — Ronald B Abelson
(74) *Attorney, Agent, or Firm* — Birch, Stewart, Kolasch & Birch, LLP

(57) ABSTRACT

A method and user equipment (UE) for transmitting a signal to a base station in a multi-antenna wireless communication system are discussed. The method can include mapping interleaver input vector sequences to an interleaver matrix, wherein each of the interleaver input vector sequences comprises vectors having a bit size of $N_L \cdot Q_m$, wherein $Q_m$ is a modulation order and $N_L$ is a number of transmission layers, reading out the interleaver matrix column by column for obtaining output bit sequences, and transmitting the output bit sequences through the transmission layers to the base station.

12 Claims, 16 Drawing Sheets

Related U.S. Application Data continuation of application No. 13/697,312, filed as application No. PCT/KR2011/003504 on May 12, 2011, now Pat. No. 8,897,247.

(60) Provisional application No. 61/334,162, filed on May 12, 2010, provisional application No. 61/334,513, filed on May 13, 2010, provisional application No. 61/349,900, filed on May 31, 2010, provisional application No. 61/373,241, filed on Aug. 12, 2010.

(51) Int. Cl.

| | | |
|---|---|---|
| *H04L 12/709* | (2013.01) | |
| *H04L 12/803* | (2013.01) | |
| *H04L 5/00* | (2006.01) | |
| *H04L 1/16* | (2006.01) | |
| *H04L 25/03* | (2006.01) | |
| *H03M 13/09* | (2006.01) | |
| *H04L 1/00* | (2006.01) | |
| *H03M 13/29* | (2006.01) | |
| *H03M 13/00* | (2006.01) | |
| *H04B 7/04* | (2006.01) | |
| *H04B 7/06* | (2006.01) | |

(52) U.S. Cl.
CPC ............ *H04L 5/0023* (2013.01); *H04L 5/0055* (2013.01); *H04L 5/0057* (2013.01); *H04L 25/03343* (2013.01); *H03M 13/09* (2013.01); *H03M 13/2957* (2013.01); *H03M 13/2963* (2013.01); *H03M 13/6356* (2013.01); *H03M 13/6362* (2013.01); *H04B 7/0417* (2013.01); *H04B 7/063* (2013.01); *H04B 7/0632* (2013.01); *H04B 7/0639* (2013.01); *H04L 1/0031* (2013.01)

(56) References Cited

U.S. PATENT DOCUMENTS

| | | |
|---|---|---|
| 2009/0296850 A1 | 12/2009 | Xu et al. |
| 2009/0316626 A1 | 12/2009 | Lee et al. |
| 2011/0141928 A1* | 6/2011 | Shin ................. H04L 1/0028 370/252 |
| 2012/0201212 A1 | 8/2012 | Xia et al. |

* cited by examiner

FIG. 5
Prior Art
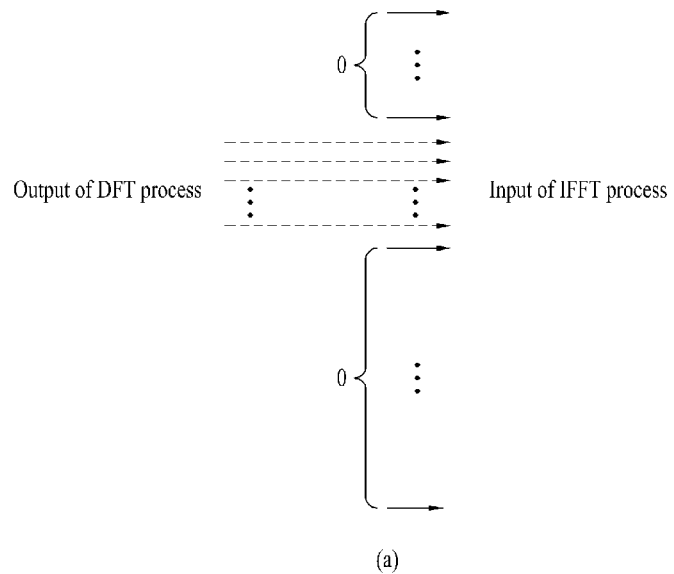
(a)
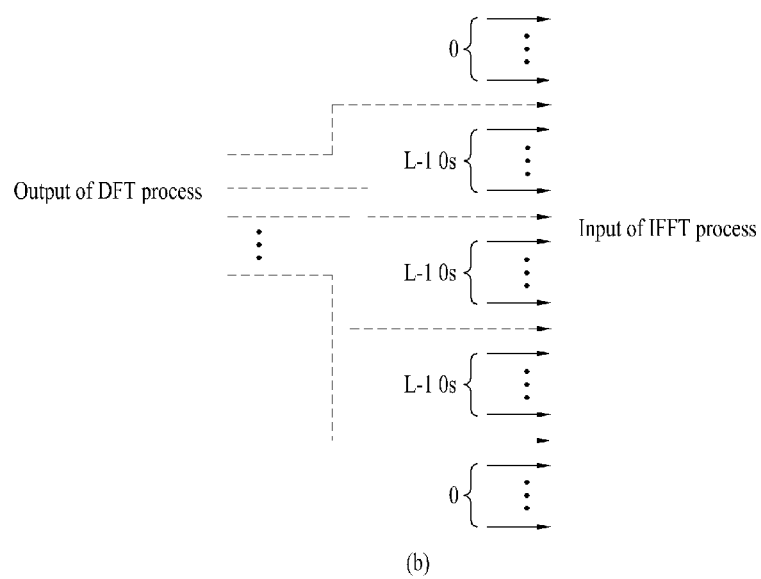
(b)

METHOD FOR PERFORMING CHANNEL INTERLEAVING IN A MULTI-ANTENNA WIRELESS COMMUNICATION SYSTEM, AND APPARATUS FOR SAME

CROSS-REFERENCE TO RELATED APPLICATIONS

This application is a continuation of U.S. patent application Ser. No. 14/523,568 filed on Oct. 24, 2014, which is a continuation of U.S. patent application Ser. No. 13/697,312 filed on Nov. 9, 2012 (now U.S. Pat. No. 8,897,247), which is a National Phase of PCT/KR2011/003504 filed on May 12, 2011, which claims priority under 35 U.S.C. 119(e) to U.S. Provisional Application Nos. 61/334,162 filed on May 12, 2010, 61/334,513 filed on May 13, 2010, 61/349,900 filed on May 31, 2010 and 61/373,241 filed on Aug. 12, 2010. The contents of all of these applications are hereby incorporated by reference as fully set forth herein in their entirety.

BACKGROUND OF THE INVENTION

1. Technical Field

The present invention relates to a wireless communication system, and more particularly, to a method and apparatus for performing channel interleaving in a multi-antenna wireless communication system.

2. Background Art

In a mobile communication system, a user equipment (UE) receives information from a base station (BS) in downlink (DL) and transmits information to the BS in uplink (UL). Information transmitted and received between the BS and the UE includes data and a variety of control information and various physical channels are present according to the kind/usage of the transmitted and received information.

FIG. 1 is a view showing physical channels used for a $3^{rd}$ Generation Partnership Project (3GPP) Long Term Evolution (LTE) system which is an example of a mobile communication system and a general signal transmission method using the same.

When a UE is powered on or when the UE newly enters a cell, the UE performs an initial cell search operation such as synchronization with a BS in step S101. For the initial cell search operation, the UE may receive a Primary Synchronization Channel (P-SCH) and a Secondary Synchronization Channel (S-SCH) from the BS so as to perform synchronization with the BS, and acquire information such as a cell ID. Thereafter, the UE may receive a physical broadcast channel from the BS and acquire broadcast information in the cell. Meanwhile, the UE may receive a Downlink Reference signal (DL RS) in the initial cell search step and confirm a downlink channel state.

The UE which has completed the initial cell search may receive a Physical Downlink Control Channel (PDCCH) and a Physical Downlink Shared Channel (PDSCH) corresponding to the PDCCH, and acquire more detailed system information in step S102.

Thereafter, the UE which has not completed access to the BS may perform a random access procedure in steps S103 to S106, in order to complete the access to the eNB. For the random access procedure, the UE may transmit a specific sequence via a Physical Random Access Channel (PRACH) as a preamble (S103), and may receive a message in response to the random access via the PDCCH and the PDSCH corresponding thereto (S104). In contention-based random access excluding handover, a contention resolution procedure including the transmission of an additional PRACH (S105) and the reception of the PDCCH and the PDSCH corresponding thereto (S106) may be performed.

The UE which has performed the above-described procedure may then receive the PDCCH/PDSCH (S107) and transmit a Physical Uplink Shared Channel (PUSCH)/Physical Uplink Control Channel (PUCCH) (S108), as a general uplink/downlink signal transmission procedure.

FIG. 2 is a view explaining a signal processing procedure of transmitting an uplink (UL) signal at a UE.

In order to transmit the UL signal, a scrambling module 201 of the UE may scramble a transmitted signal using a UE-specific scrambling signal. The scrambled signal is input to a modulation mapper 202 so as to be modulated into complex symbols by a Binary Phase Shift Keying (BPSK), Quadrature Phase Shift Keying (QPSK) or 16-Quadrature amplitude modulation (QAM) according to the kind of the transmitted signal and/or the channel state. Thereafter, the modulated complex symbols are processed by a transform precoder 203 and are input to a resource element mapper 204. The resource element mapper 204 may map the complex symbols to time-frequency resource elements. The processed signal may be transmitted to the BS via an SC-FDMA signal generator 205 and an antenna.

FIG. 3 is a diagram explaining a signal processing procedure of transmitting a downlink (DL) signal at a BS.

In a 3GPP LTE system, the BS may transmit one or more codewords in downlink. Accordingly, one or more codewords may be processed to configure complex symbols by scrambling modules 301 and modulation mappers 302, similar to the UL transmission of FIG. 2. Thereafter, the complex symbols are mapped to a plurality of layers by a layer mapper 303, and each layer may be multiplied by a precoding matrix selected according to the channel state by a precoding module 304 and may be allocated to each transmission antenna. The processed signals which will respectively be transmitted via antennas may be mapped to time-frequency resource elements to be used for transmission by resource element mappers 305, and may respectively be transmitted via OFDM signal generators 306 and antennas.

In a mobile communication system, in a case where a UE transmits a signal in uplink, a Peak-to-Average Ratio (PAPR) may be more problematic than the case where a BS transmits a signal in downlink. Accordingly, as described above with reference to FIGS. 2 and 3, an OFDMA scheme is used to transmit a downlink signal, while an SC-FDMA scheme is used to transmit an uplink signal.

FIG. 4 is a diagram explaining an SC-FDMA scheme for transmitting an uplink signal and an OFDMA scheme for transmitting a downlink signal in a mobile communication system.

A UE for UL signal transmission and a BS for DL signal transmission are identical in that a serial-to-parallel converter 401, a subcarrier mapper 403, an M-point Inverse Discrete Fourier Transform (IDFT) module 404 and a Cyclic Prefix (CP) attachment module 406 are included.

The UE for transmitting a signal using an SC-FDMA scheme further includes a parallel-to-serial converter 405 and an N-point DFT module 402. The N-point DFT module 402 partially offsets an IDFT process influence of the M-point IDFT module 404 such that the transmitted signal has a single carrier property.

FIG. 5 is a diagram explaining a signal mapping scheme in a frequency domain satisfying a single carrier property in the frequency domain. FIG. 5(a) shows a localized mapping scheme and FIG. 5(b) shows a distributed mapping scheme. Currently, the localized mapping scheme is defined in a 3GPP LTE system.

A clustered SC-FDMA scheme which is a modified form of the SC-FDMA scheme will now be described. In the clustered SC-FDMA scheme, DFT process output samples are sequentially divided into sub-groups and are mapped to sub-carrier regions which are separated from each other on a per sub-group basis in an IFFT sample input unit in a subcarrier mapping process between a DFT process and an IFFT process. In some cases, a filtering process and a cyclic extension process may be included.

At this time, a sub-group may be called a cluster and cyclic extension means that a guard interval longer than maximum delay spread of a channel is inserted between contiguous symbols in order to prevent inter-symbol interference (ISI) while each subcarrier symbol is transmitted via a multi-path channel.

SUMMARY OF THE INVENTION

An object of the present invention is to provide a method and apparatus for performing channel interleaving in a multi-antenna wireless communication system.

The technical problems solved by the present invention are not limited to the above technical problems and other technical problems which are not described herein will become apparent to those skilled in the art from the following description.

The object of the present invention can be achieved by providing a method of performing channel interleaving at a user equipment (UE) in a multi-antenna wireless communication system, the method including: generating a first interleaver input vector sequence by configuring each of channel quality indicator (CQI) information and coded data as vectors of a predetermined bit unit; generating a second interleaver input vector sequence and a third interleaver input vector sequence of the predetermined bit unit by repeating coded rank indicator (RI) information and acknowledgement (ACK)/negative ACK (NACK) information by the number $N_L$ of transmission layers and; mapping the first interleaver input vector sequence, the second interleaver input vector sequence and the third interleaver input vector sequence to an interleaver matrix; and generating an output vector sequence by reading the interleaver matrix column by column and, wherein the predetermined bit unit is defined by a product of a modulation order $Q^p_m$ and the number $N_L$ of transmission layers.

The generating the first interleaver input vector sequence may include concatenating the CQI information $q_0$, $q_1$, $q_2$, $q_3$, ..., $q_{CQI-1}$ of a $Q_{CQI}$ bit size and the data $f_0$, $f_1$, $f_2$, $f_3$, ..., $f_{G-1}$ having a G bit size; and generating the first interleaver input vector sequence $g_0$, $g_1$, $g_2$, $g_3$, ..., $g_{H'-1}$ ($H'=H/(Q^p_m \cdot N_L)$ and $H=G+Q_{CQI}$) by configuring the concatenated CQI information and data as column vectors of the predetermined bit unit.

The second interleaver input vector sequence $q'^{RI}_i$ and the third interleaver input vector sequence $q'^{ACK}_i$ are obtained by repeatedly concatenating the RI information $q^{RI}_i$ having a $Q^p_m$ bit size and the ACK/NACK information $q^{ACK}_i$ having the $Q^p_m$ bit size by $N_L$ times.

The generating the second interleaver input vector sequence $q'^{RI}_i$ and the third interleaver input vector sequence $q'^{ACK}_i$ may include applying $N_L$ layer-specific scrambling sequences to the RI information $q^{RI}_i$ having a $Q^p_m$ bit size and the ACK/NACK information $q^{ACK}_i$ having the $Q^p_m$ bit size; and concatenating the scrambled RI information and ACK/NACK information.

The mapping to the interleaver matrix may include mapping the second interleaver input vector sequence from a maximum-index row of the interleaver matrix in order of column indices for RI information; mapping the first interleaver input vector sequence from a minimum-index row of the interleaver matrix using a time-first method excluding an entry to which the first interleaver input vector sequence is mapped; and mapping the third interleaver input vector sequence from a maximum-index row of the interleaver matrix in order of column indices for ACK/NACK information, with puncturing an entry to which the first interleaver input vector sequence is mapped. Each entry of the interleaver matrix may be a vector $y_k$ having a $N_L \cdot Q^p_m$ bit size.

In another aspect of the present invention, there is provided a user equipment (UE) in a multi-antenna wireless communication system, the UE including: multiple antennas configured to transmit and receive a signal to and from a base station; and a processor configured to process the signal, wherein the processor configures channel quality indicator (CQI) information and coded data as respective vectors of a predetermined bit unit so as to generate a first interleaver input vector sequence, repeats coded rank indicator (RI) information and acknowledgement (ACK)/negative ACK (NACK) information by the number $N_L$ of transmission layers so as to generate a second interleaver input vector sequence and a third interleaver input vector sequence of the predetermined bit unit, and maps the first interleaver input vector sequence, the second interleaver input vector sequence and the third interleaver input vector sequence to an interleaver matrix, wherein an output vector sequence is generated by reading the interleaver matrix column by column, and wherein the predetermined bit unit is defined by a product of a modulation order $Q^p_m$ and the number $N_L$ of transmission layers.

The processor may concatenate the CQI information $q_0$, $q_1$, $q_2$, $q_3$, ..., $q_{CQI-1}$ of a $Q_{CQI}$ bit size and the data $f_0$, $f_2$, $f_3$, ..., $f_{G-1}$ having a G bit size, and configures the concatenated CQI information and data as column vectors of the predetermined bit unit so as to generate the first interleaver input vector sequence $g_0$, $g_1$, $g_2$, $g_3$, ..., $g_{H'-1}$ ($H'=H/(Q^p_m \cdot N_L)$ and $H=G+Q_{CQI}$).

The second interleaver input vector sequence $q'^{RI}_i$ and the third interleaver input vector sequence $q'^{ACK}_i$ may be obtained by repeatedly concatenating the RI information $q^{RI}_i$ having a $Q^p_m$ bit size and the ACK/NACK information $q^{ACK}_i$ having the $Q^p_m$ bit size by $N_L$ times.

The processor may apply $N_L$ layer-specific scrambling sequences to the RI information $q^{RI}_i$ having a $Q^p_m$ bit size and the ACK/NACK information $q^{ACK}_i$ having the $Q^p_m$ bit size, and concatenates the scrambled RI information and ACK/NACK information so as to generate the second interleaver input vector sequence $q'^{RI}_i$ and the third interleaver input vector sequence $q'^{ACK}_i$.

The second interleaver input vector sequence may be mapped from a maximum-index row of the interleaver matrix in order of column indices for RI information, the first interleaver input vector sequence may be mapped from a minimum-index row of the interleaver matrix using a time-first method excluding an entry to which the first interleaver input vector sequence is mapped, and an entry to which the first interleaver input vector sequence is mapped may be punctured and the third interleaver input vector sequence may be mapped from a maximum-index row of the interleaver matrix in order of column indices for ACK/NACK information. Each entry of the interleaver matrix may be a vector $y_k$ having a $N_L \cdot Q^p_m$ bit size.

According to the embodiments of the present invention, a user equipment (UE) can efficiently multiplex data and control information to perform channel interleaving in a multi-antenna wireless communication system.

The effects of the present invention are not limited to the above-described effects and other effects which are not described herein will become apparent to those skilled in the art from the following description.

The accompanying drawings, which are included to provide a further understanding of the invention and are incorporated in and constitute a part of this application, illustrate embodiment(s) of the invention and together with the description serve to explain the principle of the invention.

BRIEF DESCRIPTION OF THE DRAWINGS

FIG. 5 is a diagram explaining a signal mapping scheme in a frequency domain satisfying a single carrier property in the frequency domain.

DETAILED DESCRIPTION OF THE INVENTION

The configuration, operation and other features of the present invention will be understood by the embodiments of the present invention described with reference to the accompanying drawings. The following embodiments are examples of applying the technical features of the present invention to a system using a plurality of orthogonal subcarriers. Although, for convenience, the present invention is described using an IEEE 802.16 system, the present invention is applicable to various wireless communication systems including a 3$^{rd}$ Generation Partnership Project (3GPP) system.

It should be noted that specific terms disclosed in the present invention are proposed for the convenience of description and better understanding of the present invention, and the use of these specific terms may be changed to another format within the technical scope or spirit of the present invention.

Figure 1:
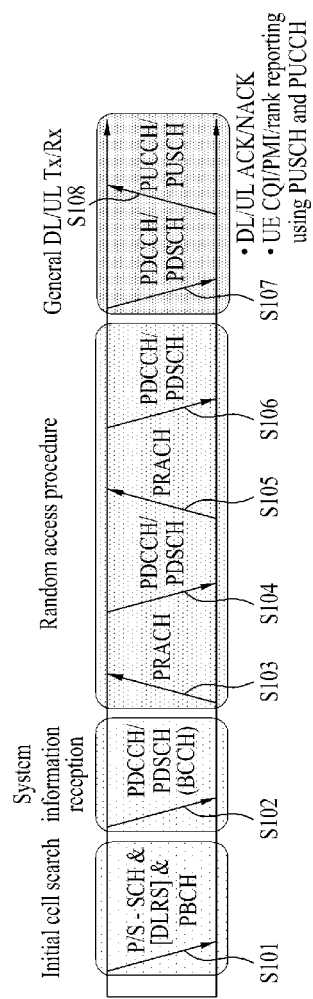
FIG. 1 is a view showing physical channels used for a 3$^{rd}$ Generation Partnership Project (3GPP) Long Term Evolution (LTE) system which is an example of a mobile communication system and a general signal transmission method using the same.
Figure 2:
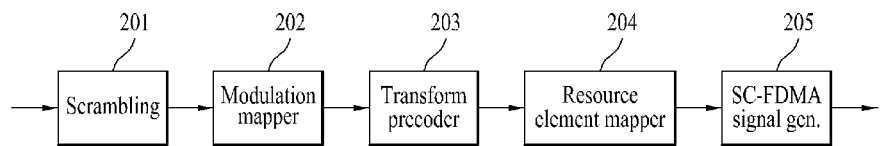
FIG. 2 is a view explaining a signal processing procedure of transmitting an uplink (UL) signal at a UE.
Figure 3:
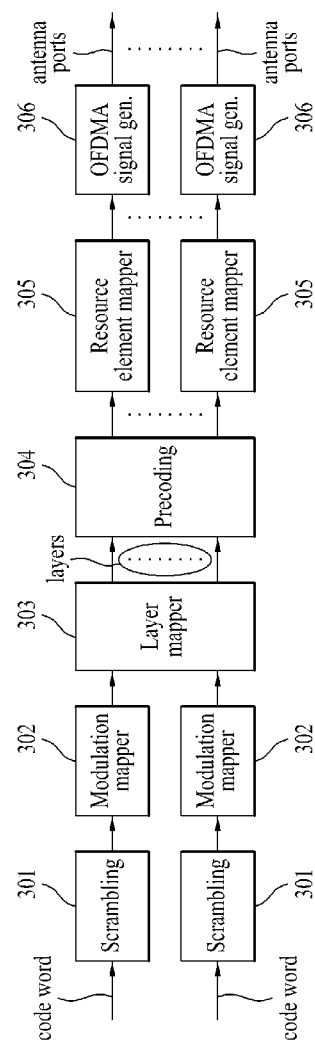
FIG. 3 is a diagram explaining a signal processing procedure of transmitting a downlink (DL) signal at a base station (BS).
Figure 4:
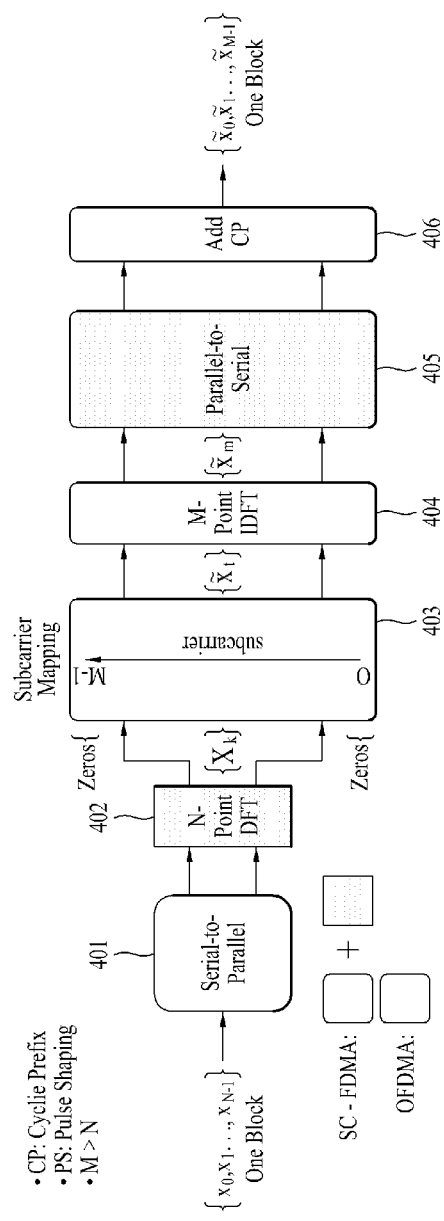
FIG. 4 is a diagram explaining an SC-FDMA scheme for transmitting an uplink signal and an OFDMA scheme for transmitting a downlink signal in a mobile communication system.
Figure 6:
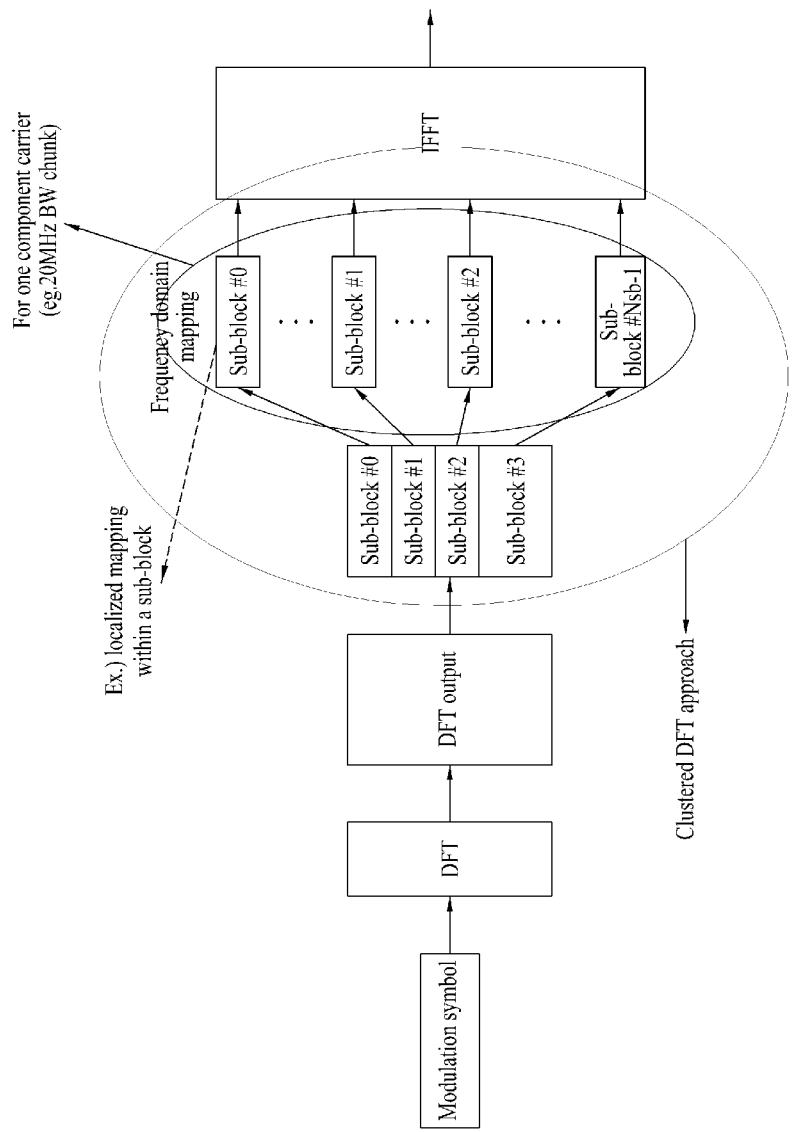
FIG. 6 is a diagram showing a signal processing procedure in which DFT process output samples are mapped to a single carrier in a clustered SC-FDMA scheme according to an embodiment of the present invention.
Figure 7:
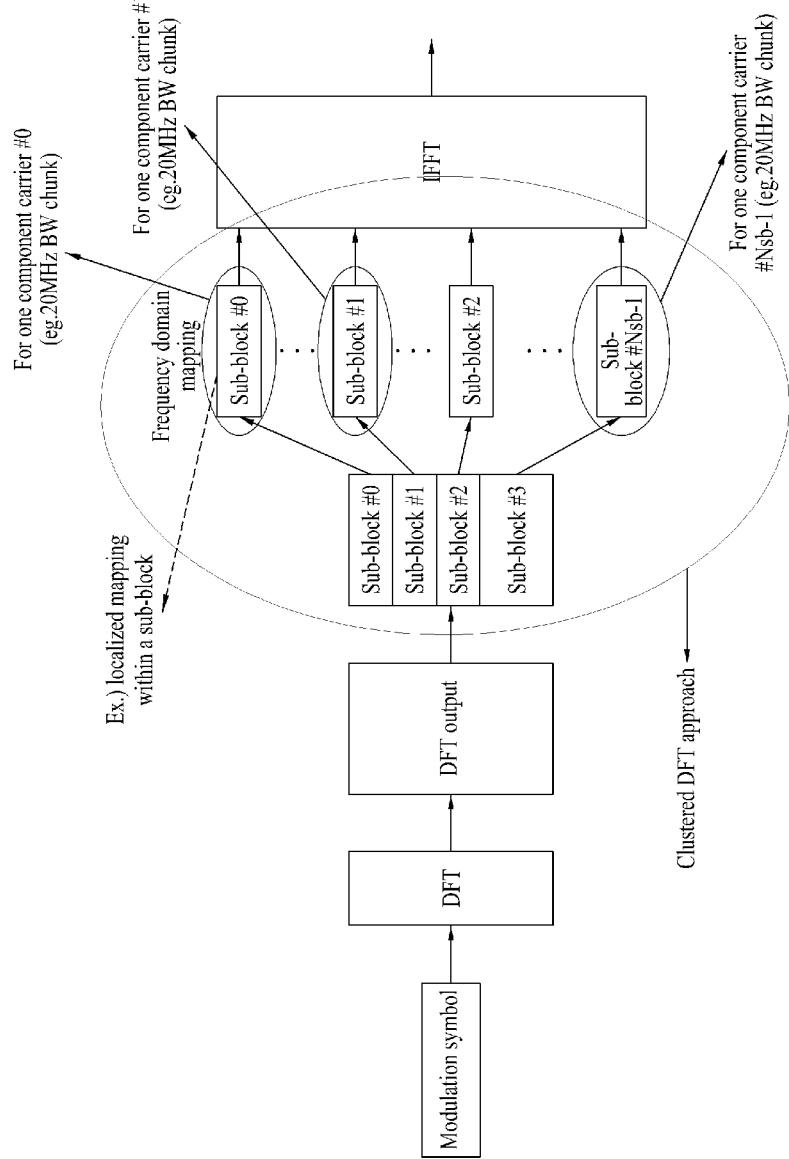
FIGS. 7 and 8 are diagrams showing a signal processing procedure in which DFT process output samples are mapped to multiple carriers in a clustered SC-FDMA scheme according to an embodiment of the present invention.
Figure 8:
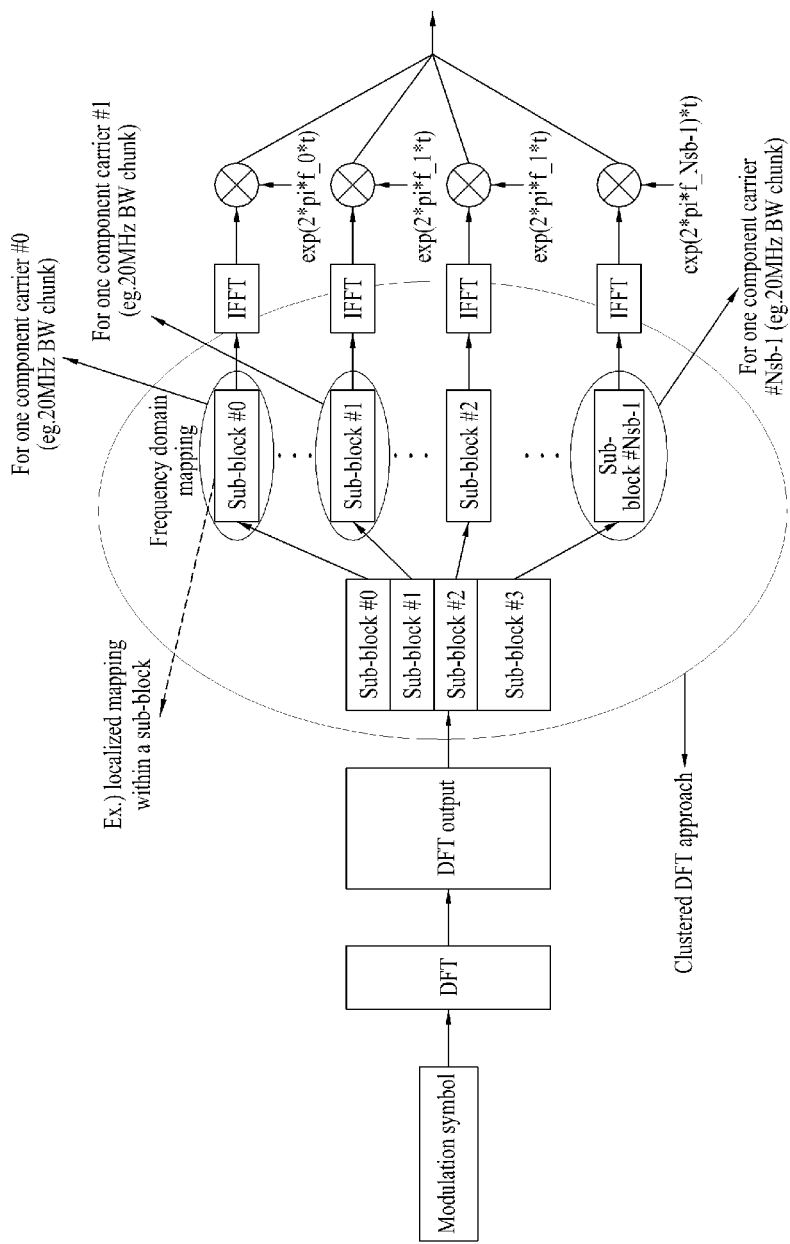

FIG. 6 is a diagram showing a signal processing procedure in which DFT process output samples are mapped to a single carrier in a clustered SC-FDMA scheme. FIGS. 7 and 8 are diagrams showing a signal processing procedure in which DFT process output samples are mapped to multiple carriers in a clustered SC-FDMA scheme.

FIG. 6 shows an example of applying a clustered SC-FDMA scheme in intra-carrier and FIGS. 7 and 8 show examples of applying a clustered SC-FDMA scheme in inter-carrier. FIG. 7 shows the case where a signal is generated by a single IFFT block if a subcarrier spacing between contiguous component carriers is aligned in a state in which component carriers are contiguously allocated in a frequency domain and FIG. 8 shows the case where a signal is generated by a plurality of IFFT blocks in a state in which component carriers are non-contiguously allocated in a frequency domain.

Figure 9:
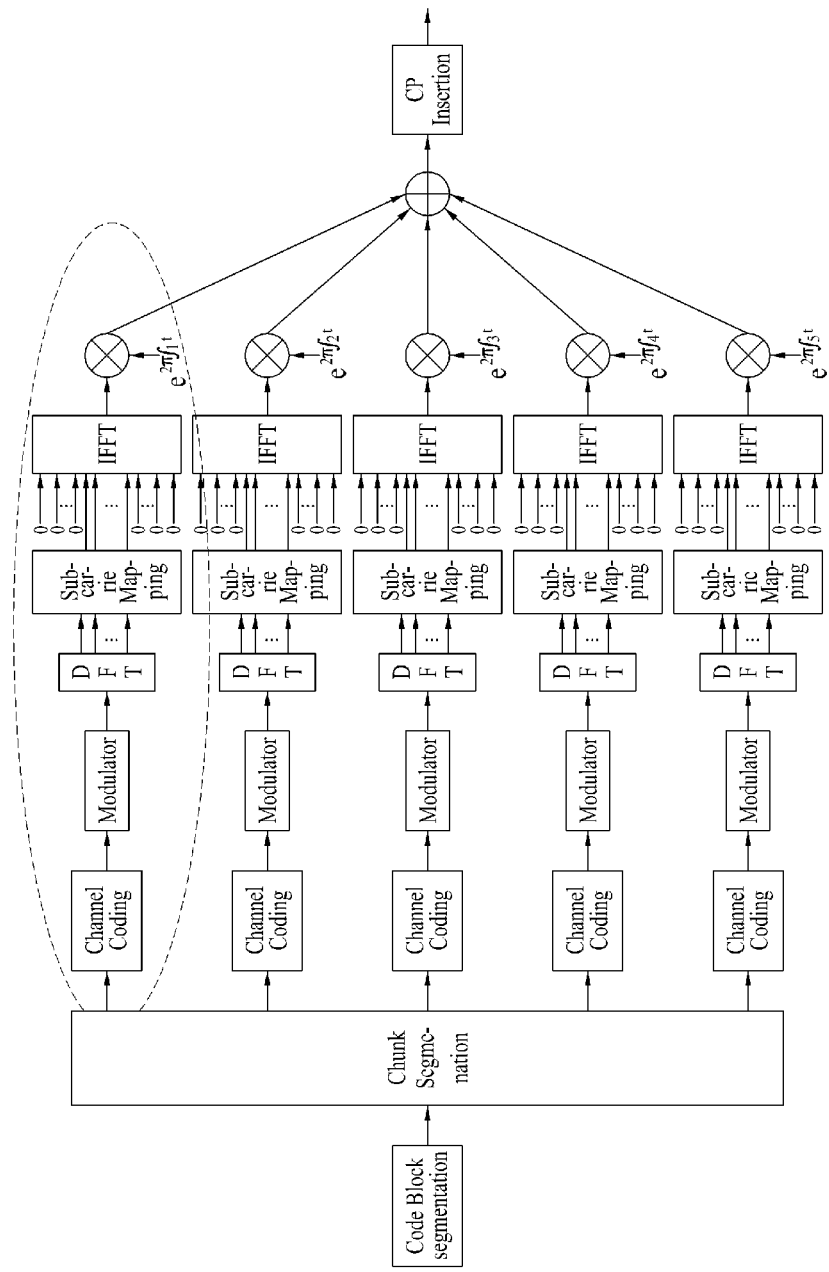
FIG. 9 is a diagram showing a signal processing procedure in a segmented SC-FDMA scheme according to an embodiment of the present invention.

In the segmented SC-FDMA scheme, IFFTs corresponding in number to a certain number of DFTs are applied such that the DFTs and the IFFTs are in one-to-one correspondence so as to extend DFT spreading of the conventional SC-FDMA scheme and the frequency subcarrier mapping configuration of the IFFTs. Therefore, the segmented SC-FDMA scheme also referred to as an NxSC-FDMA or NxDFT-s-OFDMA scheme. In the present specification, the generic term "segmented SC-FDMA" is used. FIG. 9 is a diagram showing a signal processing procedure in a segmented SC-FDMA scheme according to an embodiment of the present invention. As shown in FIG. 9, the segmented SC-FDMA scheme is characterized in that modulation symbols of an entire time domain are grouped into N (N being an integer greater than 1) groups and a DFT process is performed on a per group basis, in order to relax a single carrier property.

Figure 10:
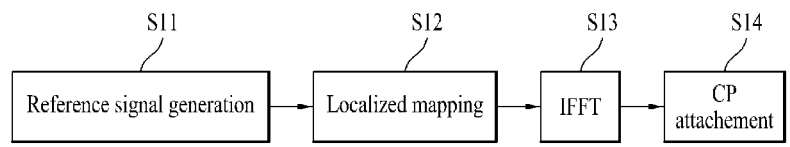
FIG. 10 is a diagram illustrating a signal processing procedure for transmitting a Reference Signal (RS) in uplink.

FIG. 10 is a diagram illustrating a signal processing procedure for transmitting a Reference Signal (RS) in uplink. As shown in FIG. 10, data is transmitted by generating a signal in a time domain, performing frequency mapping using a DFT precoder and performing IFFT. In contrast, an RS does not pass through a DFT precoder. More specifically, an RS is directly generated in a frequency domain (S11), subjected to a localized-mapping process (S12), subjected to IFFT (S13), subjected to a cyclic prefix (CP) attachment process (S14), and transmitted.

Figure 11:
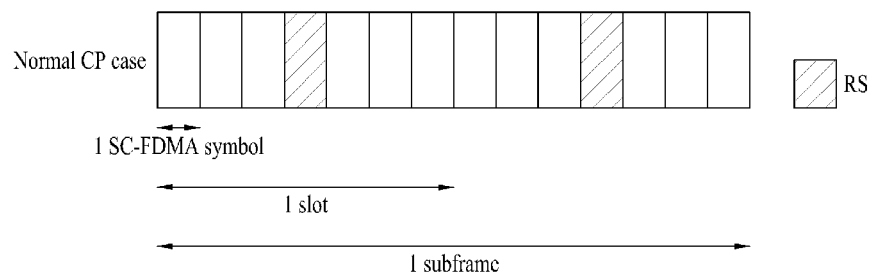
FIG. 11 is a diagram showing the structure of a subframe for transmitting an RS in a normal CP case.
Figure 12:
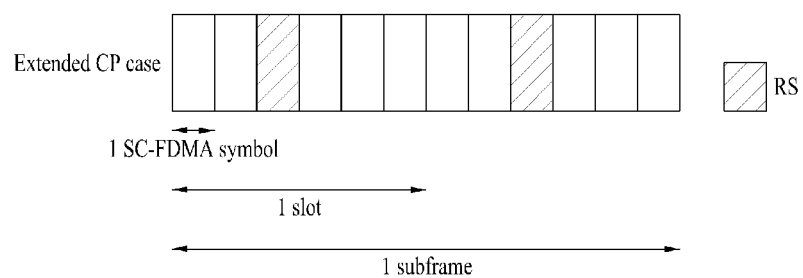
FIG. 12 is a diagram showing the structure of a subframe for transmitting an RS in an extended CP case.

FIG. 11 is a diagram showing the structure of a subframe for transmitting an RS in a normal CP case, and FIG. 12 is a diagram showing the structure of a subframe for transmitting an RS in an extended CP case. In FIG. 11, the RS is transmitted via fourth and eleventh OFDM symbols. In FIG. 12, the RS is transmitted via third and ninth symbols.

Figure 13:
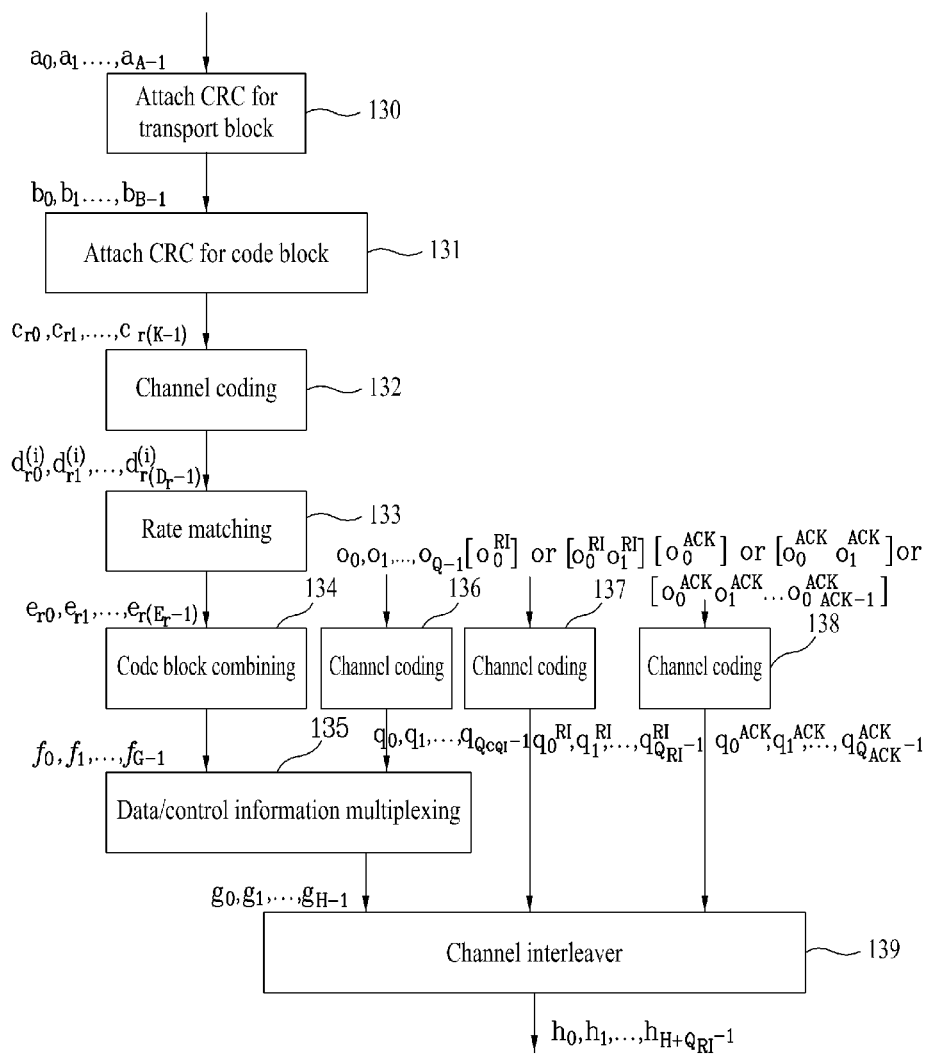
FIG. 13 is a block diagram illustrating a procedure of processing a transport channel for an uplink shared channel.

A processing structure of an uplink shared channel as a transport channel will now be described. FIG. 13 is a block diagram illustrating a procedure of processing a transport channel for an uplink shared channel. As shown in FIG. 13, cyclic redundancy check (CRC) for a transport block (TB) to be transmitted in uplink (130) is attached to data multiplexed with control information and the data multiplexed with control information is divided into several code blocks (CBs) according to TB size, and CRC for CB is attached to the several CBs (131). This result value is subjected to channel coding (132). Channel coded data is subjected to rate matching (133), CBs are combined (134) and the combined CBs are multiplexed with channel quality information (CQI)/precoding matrix index (PMI) (135).

The CQI/PMI is subjected to channel coding, separately from the data (136). The channel coded CQI/PMI is multiplexed with data (135).

In addition, rank indication (RI) is subjected to channel coding, separately from data (137).

Acknowledgement (ACK)/negative acknowledgement (NACK) is subjected to channel coding, separately from CQI/PMI and RI (138) and channel coded RI and ACK/NACK is subjected to channel interleaving, separately from the multiplexed data and CQI/PMI so as to generate an output signal (139).

In an LTE uplink system, a physical resource element (RE) for data and control channel will be described.

Figure 14:
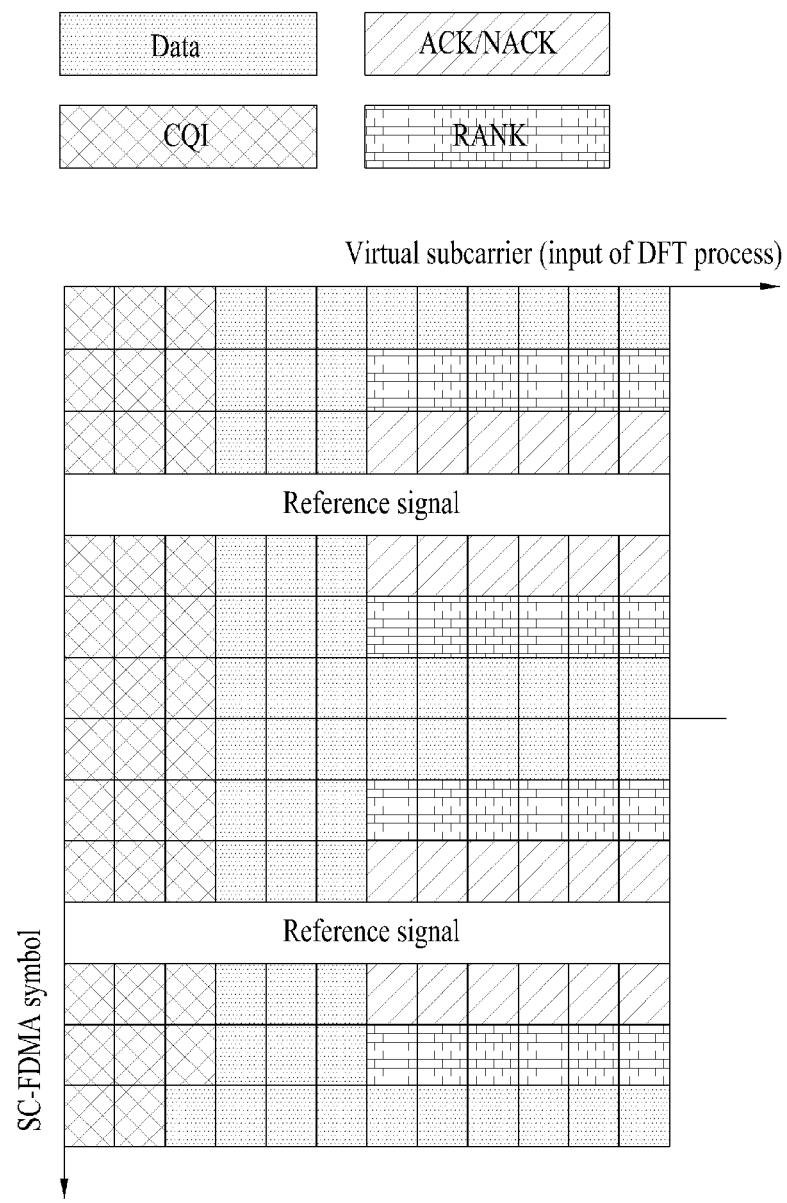
FIG. 14 is a diagram illustrating a method of mapping physical resources for transmitting uplink data and a control channel.

FIG. 14 is a diagram illustrating a method of mapping physical resources for transmitting uplink data and a control channel.

As shown in FIG. 14, CQI/PMI and data are mapped to REs using a time-first method. Encoded ACK/NACK is inserted into a punctured part around a demodulation reference signal (DM RS) symbol and RI is mapped to an RE located next to an RE where ACK/NACK is located. Resources for RI and ACK/NACK may occupy a maximum of four SC-FDMA symbols. If data and control information are simultaneously transmitted via an uplink shared channel, mapping is performed in order of RI, a concatenation of CQI/PMI and data and ACK/NACK. That is, RI is first mapped and a concatenation of CQI/PMI and data is then mapped to remaining REs excluding the RE, to which the RI is mapped, using a time-first method. ACK/NACK is mapped while puncturing the concatenation of CQI/PMI and data.

As described above, uplink control information (UCI) such as data and CQI/PMI is multiplexed so as to satisfy a single carrier property. Accordingly, it is possible to achieve uplink transmission with low cubic metric (CM).

In a system (e.g., LTE Rel-10) evolved from a conventional system, at least one of an SC-FDMA scheme and a clustered DFTs OFDMA scheme is applicable to each UE on each component carrier for uplink transmission and UL-MIMO transmission is also applicable.

Figure 15:
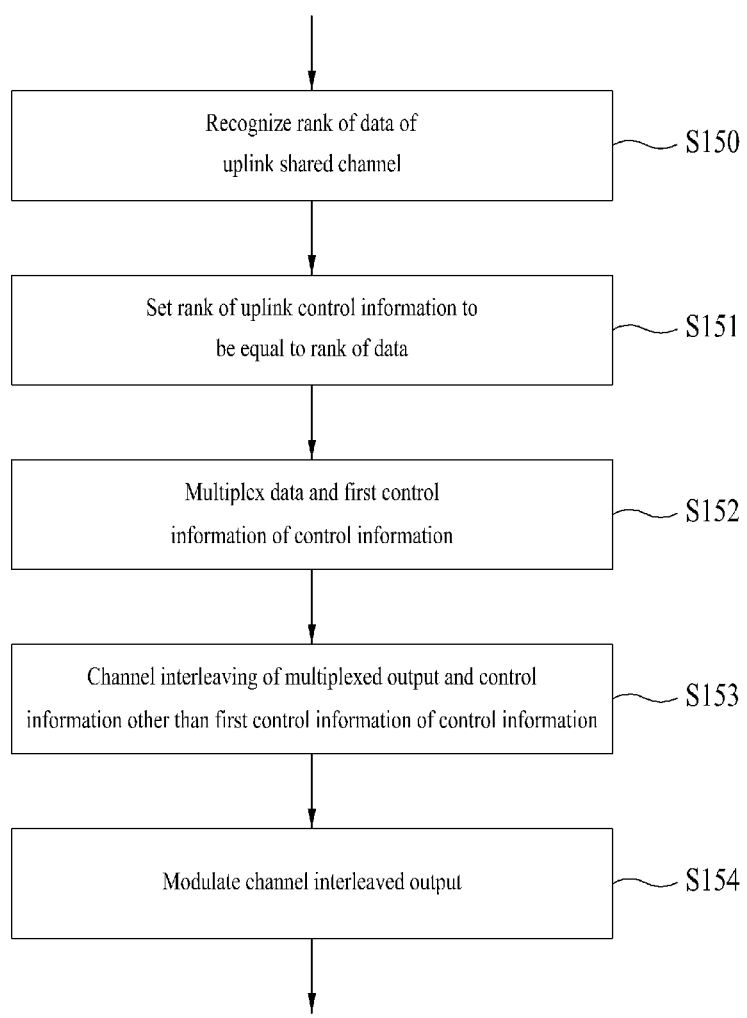
FIG. 15 is a flowchart illustrating a method of efficiently multiplexing data and a control channel on an uplink shared channel.

For clarity, it is assumed hereinafter that one slot consists of 7 OFDM symbols, and thus one subframe including two slots consists of 14 OFDM symbols in total. The number of OFDM symbols included in one subframe or the number of OFDM symbols included in one slot is for exemplary purposes only, and technical features of the present invention are not limited thereto. FIG. 15 is a flowchart illustrating a method of efficiently multiplexing data and a control channel on an uplink shared channel.

As shown in FIG. 15, a UE recognizes a rank of data of a physical uplink shared channel (PUSCH) (S150). Then, the UE sets a rank of an uplink control channel (the control channel means uplink control information (UCI) such as CQI, ACK/NACK and RI) to be equal to the rank of the data (S151). The UE multiplexes data and first control information, that is, CQI, in a concatenation manner (S152). Then, RI is mapped to a specific RE and concatenated data and CQI are mapped using a time-first method, ACK/NACK is mapped by puncturing an RE around a DM RS, thereby performing channel interleaving (S153).

Thereafter, data and a control channel may be modulated using QPSK, 16-QAM, 64-QAM, etc. according to an MCS table (S154). At this time, the modulation step may be shifted to another location (for example, the modulation block may be shifted to a previous step of the step of multiplexing the data and the control channel). In addition, channel interleaving may be performed in codeword units or layer units.

Figure 16:
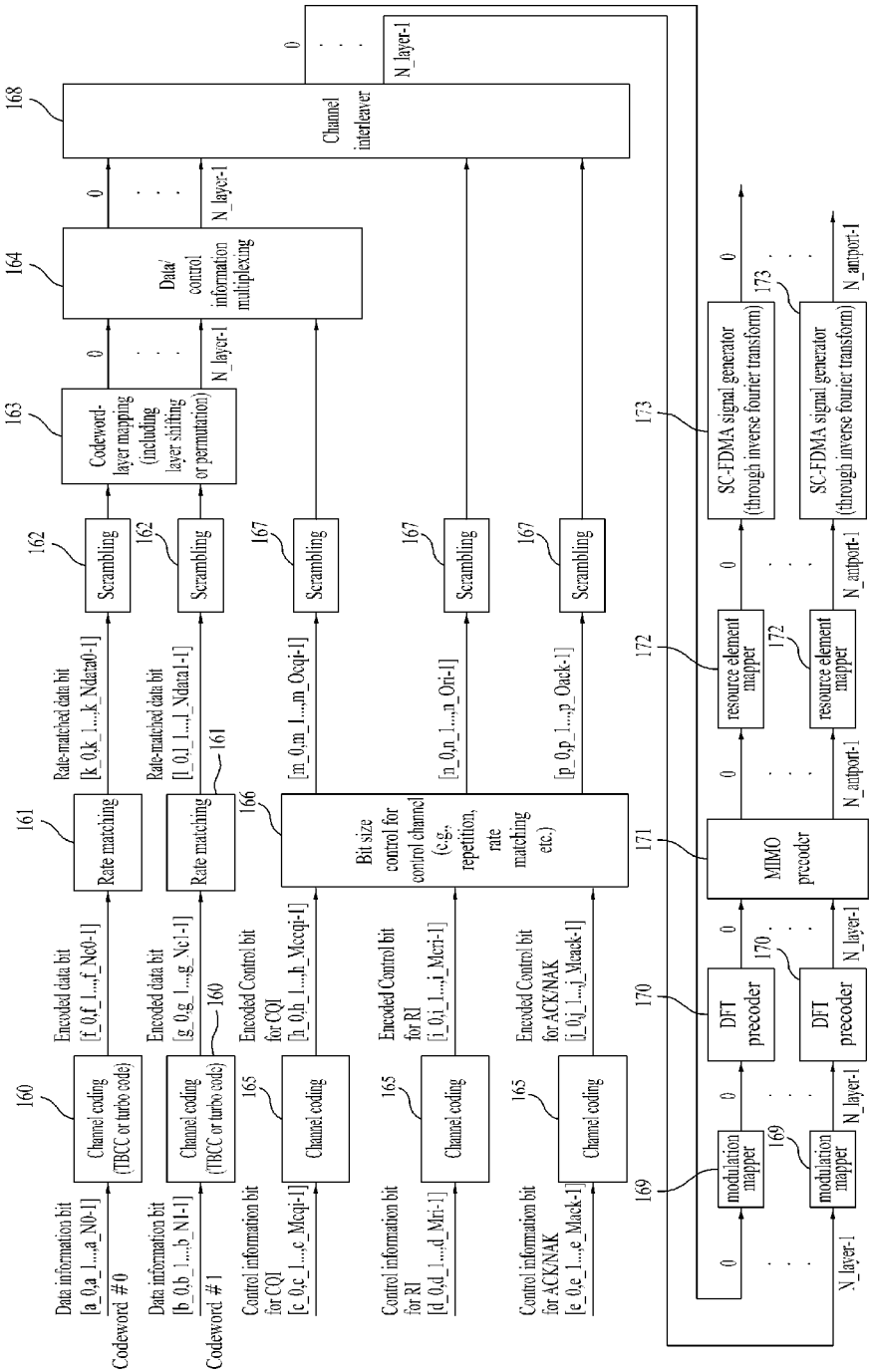
FIG. 16 is a block diagram illustrating a method of generating a transmitted signal of data and a control channel.

FIG. 16 is a block diagram illustrating a method of generating a transmitted signal of data and a control channel. The location of each block may be changed according to scheme. Two codewords are assumed. Channel coding is performed with respect to each codeword (160) and rate matching is performed according to a given MCS level and resource size (161). Then, encoded bits may be scrambled using a cell-specific, UE-specific or codeword-specific scheme (162).

Then, codeword-to-layer mapping is performed (163). In this process, layer shift or permutation may be included.

Figure 17:
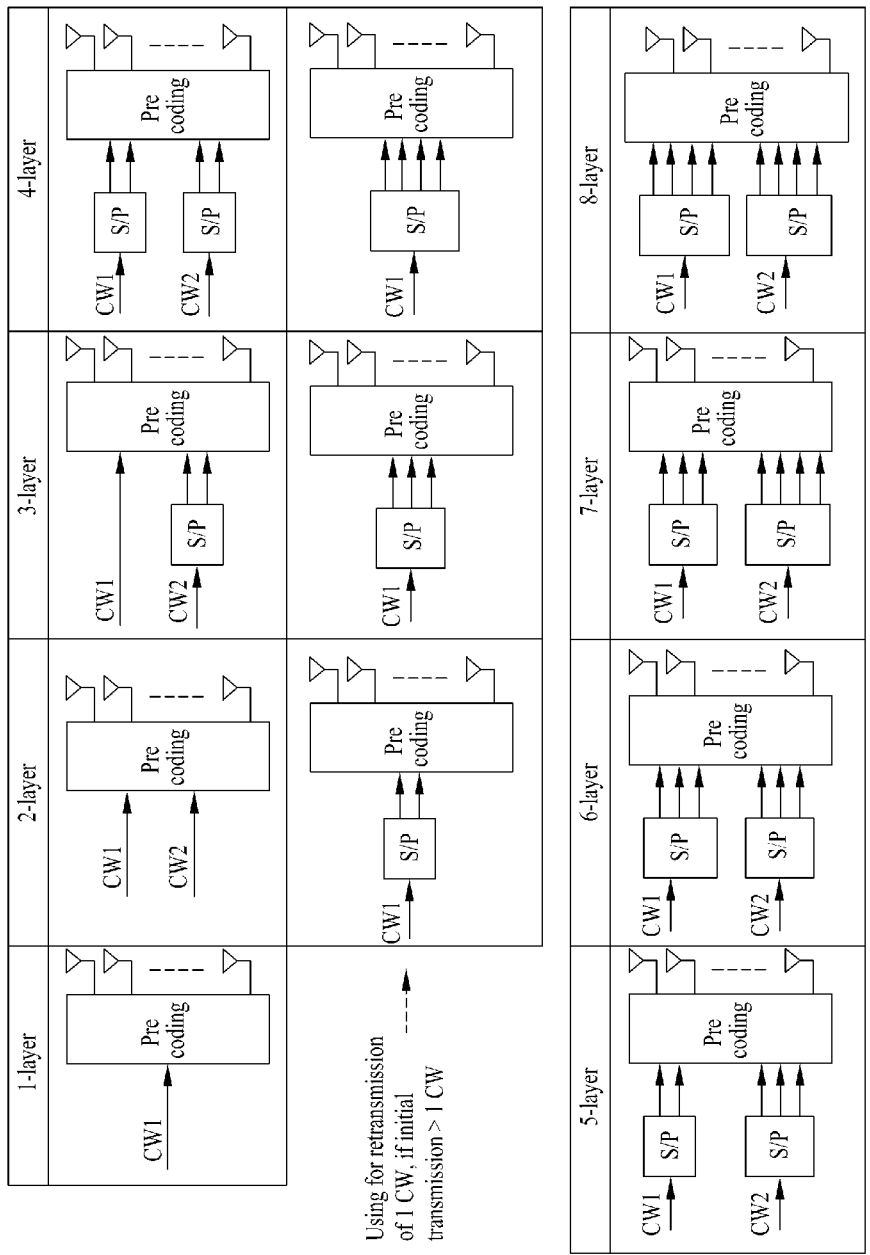
FIG. 17 is a diagram illustrating a codeword-to-layer mapping method.

FIG. 17 is a diagram illustrating a codeword-to-layer mapping method. Codeword-to-layer mapping may be performed using the rule shown in FIG. 17. A precoding location of FIG. 17 may be different from a precoding location of FIG. 13.

Control information such as CQI, RI and ACK/NACK is subjected to channel coding according to a given specification (165). At this time, CQI, RI and ACK/NACK may be coded using the same channel code with respect to all codewords or may be coded using different channel codes according to codewords.

Then, the number of encoded bits may be changed by a bit size controller (166). The bit size controller may be unified with a channel coding block 165. The signal output from the bit size controller is scrambled (167). At this time, scrambling may be performed in a cell-specific, layer-specific, codeword-specific or UE-specific manner.

The bit size controller may operate as follows.

(1) The controller recognizes a rank n_rank_pusch of data for a PUSCH.

(2) A rank n_rank_control of a control channel is set to be equal to the rank of the data (that is, n_rank_control=n_rank_pusch) and the number (n_bit_ctrl) of bits for the control channel is multiplied by the rank of the control channel to be extended.

A method of performing the above operation is performed by simply duplicating and repeating a control channel. At this time, this control channel may be an information level before channel coding or a coded bit level after channel coding. That is, for example, in case of control channel [a0, a1, a2, a3] of n_bit_ctrl=4 and n_rank_pusch=2, an extended bit number n_ext_ctrl may become 8 bits as [a0, a1, a2, a3, a0, a1, a2, a3].

If the bit size controller and a channel coder are unified, the coded bits may be generated by applying channel coding and rate matching defined in the existing system (e.g., LTE Rel-8).

In addition to the bit size controller, bit level interleaving may be performed for randomization of each layer. Alternatively, interleaving may be performed at a modulation symbol level.

The CQI/PMI channel and data for two codewords may be multiplexed by a data/control multiplexer (164). Then, while ACK/NACK information is mapped to an RE around an uplink DM RS in both slots within a subframe and a channel, a channel interleaver maps CQI/PMI according to a time-first mapping method (168).

Modulation is performed with respect to each layer (169), DFT precoding (170), MIMO precoding (171) and RE mapping (172), etc. are sequentially performed. Then, an SC-FDMA signal is generated and transmitted via an antenna port (173).

The functional blocks are not limited to the locations shown in FIG. 16 and the locations thereof may be changed as necessary. For example, the scrambling blocks 162 and 167 may be located next to a channel interleaving block. The codeword-to-layer mapping block 163 may be located next to a channel interleaving block 168 or a modulation mapper block 169.

Hereinafter, a scheme of multiplexing data and CQI defined in 3GPP LTE Release 8 described with reference to FIG. 15 and a method of interleaving the multiplexed data and CQI with other control information will be described in detail.

First, coded CQI bits are represented by $q_0, q_1, q_2, q_3, \ldots, q_{CQI-1}$ and coded data bits are represented by $f_0, f_1, f_2, f_3, \ldots, f_{G-1}$. In this case, the output of the multiplexing scheme of data and CQI according to the conventional technology may be represented by $g_0, g_1, g_2, g_3, \ldots, g_{H'-1}$. Here, $g_i$ denotes a bitwise vector having a length of $Q_m$ and is i= 0, . . . , H'−1. In addition, H' is the number of modulation symbols and is $H'=H/Q_m$, and H is the total size of coded bits for multiplexed data and CQI and is $H=(G+Q_{CQI})$ More specifically, the output of the multiplexing scheme may be configured according to Table 1.

TABLE 1

Set i, j, k to 0
while j < $Q_{CQI}$ -- first place the control information
   $g_k = [q_j \ldots q_{j+Q_m-1}]^T$
   j = j + $Q_m$
   k = k + 1
end while
while i < G -- then place the data
   $g_k = [f_i \ldots f_{i+Q_m-1}]^T$
   i = i + $Q_m$
   k = k + 1
end while According to Table 1, $g_0, \ldots, g_k$ is a vector obtained by configuring CQI information in units of $Q_m$ bits and $g_{k+1}, \ldots, g_{H'-1}$ is a vector obtained by configuring coded data in units of $Q_m$ bits.

Next, an interleaving scheme will be described. As described above, RI information is mapped to a specified RE, the multiplexed data and CQI information are mapped using a time-first method, and ACK/NACK information is mapped by puncturing the RE around the DM RS, thereby configuring the input of a channel interleaver. The output of the channel interleaver is configured in a matrix having a specific size and is referred to as an interleaver matrix, for convenience of description. This will be described in greater detail.

First, the input of the channel interleaver is represented by the multiplexed data and CQI information $g_0, g_1, g_2, \ldots g_{H'-1}$, the RI information $q_0^{RI}, q_1^{RI}, q_2^{RI}, \ldots, q_{Q'_{RI}-1}^{RI}$ and the ACK/NACK information $q_0^{ACK}, q_1^{ACK}, q_2^{ACK}, \ldots, q_{Q'_{ACK}-1}^{ACK}$. $q_k^{RI}$ and $q_k^{ACK}$ are vectors obtained by configuring the encoded RI information and the encoded ACK/NACK information in units of $Q_m$ bits through a channel encoder. The configuration of such a vector unit is obtained because columns of an interleaver matrix are defined in bit units and $q_k^{RI}$ and $q_k^{ACK}$ may be understood to denote modulation symbols, respectively. The number of modulation symbols of a subframe to which the multiplexed data and CQI information, the RI information and the ACK/NACK information are mapped, that is, the number of REs, is a total of $H'_{total}=H'+Q_{RI}$.

In this case, an output bit sequence of a channel interleaver is defined by an interleaver matrix including $R_{mux}$ rows and $C_{mux}$ columns and is defined as the number of symbols assigned to a PUSCH as $C_{mux}=N_{symb}^{PUSCH}$. Here, it is noted that $R_{mux}$ is defined in bit units and may be represented by $R_{mux}=(H'_{total} \cdot Q_m)/C_{mux}$. Meanwhile, if $R_{mux}$ is defined in modulation symbol units, $R'_{mux}=R_{mux}/Q_m$ may be obtained. In summary, the interleaver matrix is composed of $(R'_{mux} \times C_{mux})$ vectors $y_k$ and the size of $y_k$ is $Q_m$ bits. In this case, the output bit sequence of the channel interleaver is configured by the procedures of (1) to (3).

The RI information $q_0^{RI}, q_1^{RI}, q_2^{RI}, \ldots, q_{Q'_{RI}-1}^{RI}$ is mapped t0 four columns shown in Table 2 in units of a set of $Q_m$ rows. Table 2 shows column indices, to which the RI information is mapped, according to a CP configuration of a subframe.

TABLE 2

| CP configuration | Column Set |
| --- | --- |
| Normal | {1, 4, 7, 10} |
| Extended | {0, 3, 5, 8} |

More specifically, the RI information, $q_0^{RI}, q_1^{RI}, q_2^{RI}, \ldots, q_{Q'_{RI}-1}^{RI}$ is mapped from a last row of the four columns shown in Table 2 in reverse order and may be configured in an interleaver matrix according to Table 3. For example, in a subframe to which normal CP is applied, the RI information is mapped in order of a last row of a first index column, a last row of a tenth index column, a last row of a seventh index column and a last row of a fourth index column and then the RI information is mapped in the same column index order after reducing the row index.

TABLE 3

Set i, j to 0.
Set r to $R'_{mux} - 1$
while i < $Q'_{RI}$
   $c_{RI}$ = Column Set(j)
   $y_{r \times C_{mux} + c_{RI}} = q_i^{RI}$
   i = i + 1
   r = $R'_{mux} - 1 - \lfloor i/4 \rfloor$
   j = (j + 3) mod 4
end while In Table 3, ColumnSet(j) denotes a vector shown in Table 2 and j denotes the index of the vector of Table 2. For example, in a subframe to which normal CP is applied, ColumnSet(0) indicates a first column and ColumnSet(2) indicates a seventh column.

(2) Next, the multiplexed data and CQI information is configured in an interleaver matrix having a size of $(R_{mux} \cdot C_{mux})$ in units of a set of $Q_m$ rows, that is, in $R'_{mux}$ units as shown in Tables 4 and 5. More specifically, $g_k$ which is the multiplexed data and CQI information is a bitwise column vector having a length of $Q_m$ and is k=0, . . . , H'−1 (where, $H'=R'_{mux} \times C_{mux}$). $g_k$ is mapped as $y_k=g_k$ and an already assigned entry of an interleaver matrix, that is, $y_k$ to which the RI information is assigned is skipped.

TABLE 4

$$\begin{bmatrix} \underline{y}_0 & \underline{y}_1 & \underline{y}_2 & \cdots & \underline{y}_{C_{mux}-1} \\ \underline{y}_{C_{mux}} & \underline{y}_{C_{mux}+1} & \underline{y}_{C_{mux}+2} & \cdots & \underline{y}_{2C_{mux}-1} \\ \vdots & \vdots & \vdots & \ddots & \vdots \\ \underline{y}_{(R'_{mux}-1)\times C_{mux}} & \underline{y}_{(R'_{mux}-1)\times C_{mux}+1} & \underline{y}_{(R'_{mux}-1)\times C_{mux}+2} & \cdots & \underline{y}_{(R'_{mux}\times C_{mux}-1)} \end{bmatrix}$$

TABLE 5

```
Set i, k to 0.
  while k < H',
    if y_i is not assigned to RI symbols
      y_i = g_k
      k = k + 1
    end if
    i = i + 1
  end while
```

(3) Finally, mapping of the ACK/NACK information $q_0^{ACK}, q_1^{ACK}, q_2^{ACK}, \ldots, q_{Q'_{ACK}-1}$ to an interleaver matrix will be described. Similarly to the RI information, the ACK/NACK information $q_0^{ACK}, q_1^{ACK}, q_2^{ACK}, \ldots, q_{Q'_{ACK}-1}$ is mapped to columns shown in Table 6 in units of a set of $Q_m$ rows, that is, in $R'_{mux}$ units. Table 6 shows columns indices, to which the ACK/NACK information is mapped, according to a CP configuration of a subframe. However, the ACK/NACK information is different from the RI information in that the ACK/NACK information is mapped after an entry $\underline{y}_k$ to which $g_k$ is mapped is punctured.

TABLE 6

| CP configuration | Column Set |
|---|---|
| Normal | {2, 3, 8, 9} |
| Extended | {1, 2, 6, 7} |

More specifically, the ACK/NACK information $q_0^{ACK}, q_1^{ACK}, q_2^{ACK}, \ldots, q_{Q'_{ACK}-1}$ is mapped from a last row in reverse order and may be configured in an interleaver matrix according to Table 7. For example, in a subframe to which normal CP is applied, $\underline{g}_k$ is punctured and the ACK/NACK information is mapped in order of a last row of a second index column, a last row of a ninth index column, a last row of an eighth index column and a last row of a third index column. Thereafter, $\underline{g}_k$ is punctured and the ACK/NACK information is mapped in the same column index order after reducing the row index.

TABLE 7

```
Set i, j to 0.
Set r to R'_mux - 1
  while i < Q'_ACK
    c_ACK = ColumnSet(j)
    y_r×C_mux+c_ACK = q_i^ACK
    i = i + 1
    r = R'_mux - 1 - ⌊i/4⌋
    j = (j + 3)mod 4
  end while
```

In Table 7, ColumnSet(j) denotes a vector shown in Table 6 and j denotes the index of the vector of Table 6. For example, in a subframe to which normal CP is applied, ColumnSet(0) indicates a second column and ColumnSet(2) indicates an eighth column.

An interleaver matrix having a size of $(R_{mux} \times C_{mux})$ configured through the procedures of (1) to (3) is read column by column and an output bit sequence, that is, a codeword is generated. The output bit sequence subjected to channel interleaving may be represented by $h_0, h_1, h_2, \ldots, h_{H+Q_{RI}-1}$.

The interleaving scheme of LTE Release 8 is defined on the assumption of single layer uplink transmission in the case where a codeword-to-layer mapping relationship is 1:1 and thus is not suitable when uplink transmission supports multiple layers as in LTE Release 10. Accordingly, in the present invention, a scheme of multiplexing CQI and data and a channel interleaving method are proposed in order to support multi-layer transmission. The present invention is applicable to the case where one codeword is mapped to N layers and, for convenience of description, it is assumed that one codeword is mapped to two layers.

If one codeword is mapped to $N_L$ layers, uplink control information may be repeated (RI and ACK/NACK) or distributed (CQI) and mapped to the layers. In this case, in order to assign the same number of REs to the uplink control information in each of the $N_L$ layers, the following method of multiplexing data and CQI information and the interleaving method are applicable.

<Multiplexing of Data and CQI Information for Multi-Layer Transmission>

CQI information $q_0, q_1, q_2, q_3, \ldots, q_{Q_{CQI}-1}$ having a $Q_{CQI}$ bit size and data $f_0, f_1, f_2, f_3, \ldots, f_{G-1}$ having a G bit size are multiplexed using a concatenation method so as to generate an input $g_0, g_1, g_2, g_3, \ldots, g_{H'-1}$ of a channel interleaver. Here, $g_i$ denotes a bitwise vector having a length of $(N_L \cdot Q^p_m)$. Here, $i=0, \ldots, H'-1$ and $Q^p_m$ is a modulation order of a p-th index codeword. In addition, H' is $H'=H/(Q^p_m \cdot N_L)$ and H is the total bit size of the multiplexed data and data and is $H=(G+Q_{CQI})$. More specifically, the output of the multiplexing method may be configured according to Table 8.

TABLE 8

```
Set i, j, k to 0
  while j < Q_CQI -- first place the control information
    g_k = [q_j ... q_{j+Q^pm·N_L-1}]^T
    j = j + Q^p_m · N_L
    k = k + 1
  end while
  while i < G -- then place the data
    g_k = [f_i ... f_{i+Q^pm·N_L-1}]^T
    i = i + Q^p_m · N_L
    k = k + 1
  end while
```

According to Table 8, $g_0, \ldots, g_k$ is a vector in which the CQI information is configured in $(Q^p_m \cdot N_L)$ bit units and $g_{k+1}, \ldots, g_{H'-1}$ is a vector in which the coded data is configured in $(Q^p_m \cdot N_L)$ bit units.

However, if the size of the CQI bits is not a multiple of $(Q^p_m \cdot N_L)$, a null signal may be generated upon layer mapping after the multiplexing method of Table 8. In order to prevent the null signal from being generated, the output of the multiplexing method may be configured as shown in Table 9.

TABLE 9

```
Set i, j, k to 0
  while j < Q_CQI
    g'_k = [q_j ... q_{j+Q^pm-1}]
    j = j + Q^p_m
    k = k + 1
  end while
  while i < G
    g'_k = [f_i ... f_{i+Q^pm-1}]^T
    i = i + Q^p_m
    k = k + 1
```

TABLE 9-continued end while
$\underline{g}_k = [\underline{g}'_{(N_L \cdot k)} \underline{g}'_{(N_L \cdot k)+1} \cdots \underline{g}'_{(N_L \cdot k)+N_L-1}]^T$
( k = 0, 1, ... H' − 1 )

<Channel Interleaving Method for Multi-Layer Transmission>

The input of the channel interleaver of the present invention is composed of $g_0, g_1, g_2, \ldots, g_{H'-1}$ which is the multiplexed data and CQI information, RI information $\underline{q}'_0{}^{RI}, \underline{q}'_1{}^{RI}, \underline{q}'_2{}^{RI}, \ldots, \underline{q}'_{Q'_{RI}-1}{}^{RI}$ and ACK/NACK information $\underline{q}'_0{}^{ACK}, \underline{q}'_1{}^{ACK}, \underline{q}'_2{}^{ACK}, \ldots, \underline{q}'_{Q'_{ACK}-1}{}^{ACK}$. Here, $\underline{q}_i{}^{RI}$ and $\underline{q}_i{}^{ACK}$ are vector sequences generated by repeating vectors $\underline{q}_i{}^{RI}$ and $\underline{q}_i{}^{ACK}$ each having a $Q^k_m$ bit size $N_L$ times and the size thereof is $Q^k_m \times N_L$. In particular, $Q^k_m$ is a modulation order for RI information and ACK/NACK information and is applied to all codewords. Hereinafter, for convenience of description, it is assumed that $Q^k_m$ and $Q^p_m$ are the same. In this case, the bit size of $\underline{q}'_i{}^{RI}$ and $\underline{q}'_i{}^{ACK}$ is $(Q^p_m \cdot N_L)$ and is equal to the bit size of $g_i$.

For example, if $N_L$ is 2, $\underline{q}'_i{}^{RI}$ is defined as $[\underline{q}_i{}^{RI}, \underline{q}_i{}^{RI}]^T$ (i=0, 1, ..., $Q'_{RI}-1$) and $\underline{q}'_i{}^{ACK}$ is defined as $[\underline{q}_i{}^{ACK}, \underline{q}_i{}^{ACK}]^T$ (i=0, 1, ..., $Q'_{ACK}-1$). In this case, if $Q^k_m$ is 4, that is, QPSK, $\underline{q}'_i{}^{RI}$ and $\underline{q}'_i{}^{ACK}$ are 8 bits.

(b) The case where a layer-specific scrambling sequence or a codeword-specific scrambling sequence is applied to the RI information and the ACK/NACK information may be taken into consideration. If the layer-specific scrambling sequence is applied, $\underline{q}_i{}^{RI}$ and $\underline{q}_i{}^{ACK}$ having a $Q^p_m$ bit size are scrambled using $N_L$ different layer-specific scrambling sequences and then are concatenated, thereby generating vector sequences $\underline{q}'_i{}^{RI}$ and $\underline{q}'_i{}^{ACK}$ each having a $Q^p_m \cdot N_L$ bit size.

For example, if $N_L=2$, $\underline{q}'_i{}^{RI}=[\underline{q}_{i,0}{}^{RI}, \underline{q}hd\, i,1^{RI}]^T$ (i=0, 1, ..., $Q'_{RI}-1$) and $\underline{q}'_i{}^{ACK}=[\underline{q}_{i,0}{}^{ACK}, \underline{q}_{i,1}{}^{ACK}]^T$ (i=0, 1, ..., $Q'_{ACK}-1$). At this time, $\underline{q}_{i,0}{}^{RI}$ and $\underline{q}_{i,1}{}^{RI}$ respectively indicate RI vector sequences mapped to a layer having a $0^{th}$ index and a layer having a first layer, and $\underline{q}_{i,0}{}^{ACK}$ and $\underline{q}_{i,1}{}^{ACK}$ respectively indicate ACK/NACK vector sequences mapped to a layer having a $0^{th}$ index and a layer having a first layer.

In addition, if the codeword-specific scrambling sequence is applied, $\underline{q}_i{}^{RI}$ and $\underline{q}_i{}^{ACK}$ each having a $Q^p_m$ bit size are repeated $N_L$ times and the codeword-specific scrambling sequence is applied, thereby generating vector sequences $\underline{q}'_i{}^{RI}$ and $\underline{q}'_i{}^{ACK}$ each having a $Q^p_m \cdot N_L$ bit size.

(c) The output bit sequence of the channel interleaver according to the present invention is defined by an interleaver matrix including $R_{mux}$ rows and $C_{mux}$ columns and $C_{mux}=N_{symb}{}^{PUSCH}$ is defined as the number of symbols assigned to a PUSCH. Here, the present invention is different from the conventional technology in that the number of $R_{mux}$ is defined as $(N_L \cdot H'_{total} \cdot Q^p_m)/C_{mux}$. Similarly, $R_{mux}$ is defined in bit units and $R'_{mux}=R_{mux}/Q^p_m$ may be obtained if $R_{mux}$ is defined in modulation symbol units. In summary, the interleaver matrix includes $(R'_{mux} \times C_{mux})$ vectors $\underline{y}_k$, and the size of $\underline{y}_k$ is $N_L \cdot Q^p_m$ bits.

(d) The RI vector sequence $\underline{q}'_0{}^{RI}, \underline{q}'_1{}^{RI}, \underline{q}'_2{}^{RI}, \ldots, \underline{q}'_{Q'_{RI}-1}{}^{RI}$ generated in (a) and (b) is mapped in reverse order of indices in units of a set of $N_L \cdot Q^p_m$ rows corresponding to the columns shown in Table 2, that is, in $R'_{mux}$ units. More specifically, the RI vector sequence $\underline{q}'_0{}^{RI}, \underline{q}'_1{}^{RI}, \underline{q}'_2{}^{RI}, \ldots, \underline{q}'_{Q'_{RI}-1}{}^{RI}$ has a size of $(Q^p_m \cdot N_L)$ and is mapped from a last row of the interleaver matrix in reverse order of indices according to Table 10.

TABLE 10

Set i, j to 0.
Set r to $R'_{mux}$ − 1
while i < $Q'_{RI}$
    $c_{RI}$ = Column Set(j)
    $\underline{y}_{r \times C_{mux}+c_{RI}} = \underline{q}'_i{}^{RI}$
    i = i + 1
    r = $R'_{mux}$ − 1 − $\lfloor i/4 \rfloor$
    j = (j + 3) mod 4
end while For example, in a subframe to which normal CP is applied, the RI vector sequence having a size of $(Q^p_m \cdot N_L)$ is mapped in order of a last row of a first index column, a last row of a tenth index column, a last row of a seventh index column and a last row of a fourth index column and then the RI vector sequence having a size of $(Q^p_m \cdot N_L)$ is mapped in the same column index order after reducing the row index.

In Table 10, ColumnSet(j) denotes a vector shown in Table 2 and j denotes the index of the vector of Table 2. For example, in a subframe to which normal CP is applied, ColumnSet(0) indicates a first column and ColumnSet(2) indicates a seventh column.

(e) Next, the multiplexed data and CQI information is configured in an interleaver matrix having a size of $R'_{mux}$ in units of a set of $N_L \times Q^p_m$ rows, that is, $R'_{mux}$ units, as shown in Table 11. More specifically, $y_k$ is a row vector having a $N_L \times Q^p_m$ bit size and $g_k$ which is the multiplexed data and CQI information is a bitwise column vector having a length of $(Q^p_m \cdot N_L)$ and is k=0, ..., H'−1 (where, H'=$R'_{mux} \times C_{mux}$). $g_k$ is mapped as $\underline{y}_k = g_k$ and an already assigned entry of an interleaver matrix, that is, $\underline{y}_k$, to which the RI information is assigned, is skipped.

TABLE 11

$$\begin{bmatrix} \underline{y}_0 & \underline{y}_1 & \underline{y}_2 & \cdots & \underline{y}_{C_{mux}-1} \\ \underline{y}_{C_{mux}} & \underline{y}_{C_{mux}+1} & \underline{y}_{C_{mux}+2} & \cdots & \underline{y}_{2C_{mux}-1} \\ \vdots & \vdots & \vdots & \ddots & \vdots \\ \underline{y}_{(R'_{mux}-1) \times C_{mux}} & \underline{y}_{(R'_{mux}-1) \times C_{mux}+1} & \underline{y}_{(R'_{mux}-1) \times C_{mux}+2} & \cdots & \underline{y}_{(R'_{mux} \times C_{mux}-1)} \end{bmatrix}$$

(f) Finally, mapping of the ACK/NACK vector sequence $\underline{q}'_0{}^{ACK}, \underline{q}'_1{}^{ACK}, \underline{q}'_2{}^{ACK}, \ldots, \underline{q}'_{Q'_{ACK}-1}{}^{ACK}$ generated in (a) and (b) to an interleaver matrix will be described.

Similarly to the RI vector sequence mapping, the ACK/NACK vector sequence $\underline{q}'_0{}^{ACK}, \underline{q}'_1{}^{ACK}, \underline{q}'_2{}^{ACK}, \ldots, \underline{q}'_{Q'_{ACK}-1}{}^{ACK}$ is mapped to columns shown in Table 6 in units of a set of $N_L \cdot Q^p_m$ rows, that is, in $R'_{mux}$ units. However, the ACK/NACK vector sequence is different from the RI vector sequence in that the ACK/NACK vector sequence is mapped after an entry, to which $g_k$ is mapped, is punctured.

More specifically, the ACK/NACK vector sequence $\underline{q}'_0{}^{ACK}, \underline{q}'_1{}^{ACK}, \underline{q}'_2{}^{ACK}, \ldots, \underline{q}'_{Q'_{ACK}-1}{}^{ACK}$ is mapped from a last row in reverse order and may be configured in an interleaver matrix according to Table 12. For example, in a subframe to which normal CP is applied, $g_k$ is punctured and the ACK/NACK vector sequence is mapped in order of a last row of a second index column, a last row of a ninth index column, a last row of an eighth index column and a last row of a third index column. Thereafter, $g_k$ is punctured and the ACK/NACK vector sequence is mapped in the same column index order after reducing the row index.

TABLE 12

```
Set i, j to 0.
Set r to R'_mux - 1
while i < Q'_ACK
    c_ACK = ColumnSet(j)
    y_{r×C_mux + c_ACK} = q'_i^{ACK}
    i = i + 1
    r = R'_mux - 1 - ⌊i/4⌋
    j = (j + 3)mod 4
end while
```

In Table 12, ColumnSet(j) denotes a vector shown in Table 6 and j denotes the index of the vector of Table 6. For example, in a subframe to which normal CP is applied, ColumnSet(0) indicates a second column and ColumnSet(2) indicates an eighth column.

(g) Similarly, an interleaver matrix having a size of ($R_{mux} \times C_{mux}$) is read column by column and an output bit sequence, that is, a codeword, is generated. The output bit sequence subjected to channel interleaving may be represented by $h_0$, $h_1$, $h_2$, ..., $h_{H+Q_{RI}-1}$.

(h) Although it is assumed that $Q^p_m$ which is the modulation order of the p-th index codeword and $Q^k_m$ which is the modulation order of the RI information and the ACK/NACK information are the same, $Q^p_m$ and $Q^k_m$ may be different. In this case, the output of the channel interleaver is read as the vector sequence and is configured again in bit units. That is, $Q^p_m$ bits are assigned to one symbol with respect to data and CQI and $Q^k_m$ bits are assigned to one symbol with respect to ACK/NACK and RI.

If one codeword is mapped to multiple layers, the number of bits of the column continuously assigned to each layer is $Q^p_m$ bits with respect to CQI and data and is $Q^k_m$ bits with respect to ACK/NACK and RI.

According to the present invention, the same number of REs may be assigned to all layers to which uplink control information mapped to a specific codeword is assigned.

Figure 18:
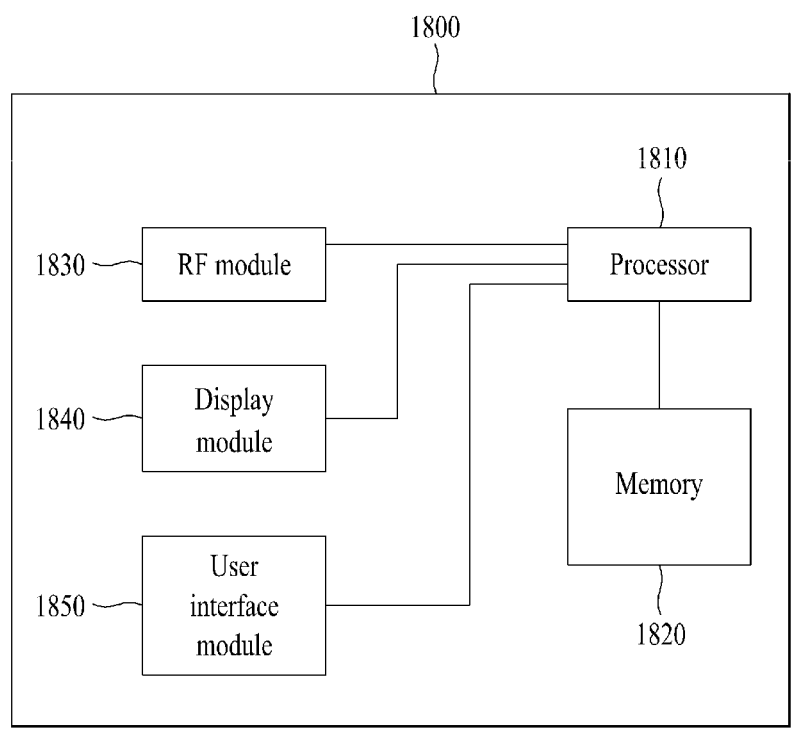
FIG. 18 is a block diagram of a communication apparatus according to an embodiment of the present invention.

FIG. 18 is a block diagram of a communication apparatus according to an embodiment of the present invention.

Referring to FIG. 18, a communication apparatus 1800 includes a processor 1810, a memory 1820, a Radio Frequency (RF) module 1830, a display module 1840 and a user interface module 1850.

The communication apparatus 1800 is shown for convenience of description and some modules thereof may be omitted. In addition, the communication apparatus 1800 may further include necessary modules. In addition, some modules of the communication apparatus 1800 may be subdivided. The processor 1810 is configured to perform an operation of the embodiment of the present invention described with respect to the drawings. For a detailed description of the operation of the processor 1810, reference may be made to the description associated with FIGS. 1 to 17.

The memory 1820 is connected to the processor 1810 so as to store an operating system, an application, program code, data and the like. The RF module 1830 is connected to the processor 1810 so as to perform a function for converting a baseband signal into a radio signal or converting a radio signal into a baseband signal. The RF module 1830 performs analog conversion, amplification, filtering and frequency up-conversion or inverse processes thereof. The display module 1840 is connected to the processor 1810 so as to display a variety of information. As the display module 1840, although not limited thereto, a well-known device such as a Liquid Crystal Display (LCD), a Light Emitting Diode (LED), or an Organic Light Emitting Diode (OLED) may be used. The user interface module 1850 is connected to the processor 1810 and may be configured by a combination of well-known user interfaces such as a keypad and a touch screen.

The above-described embodiments are proposed by combining constituent components and characteristics of the present invention according to a predetermined format. The individual constituent components or characteristics should be considered to be optional factors on the condition that there is no additional remark. If required, the individual constituent components or characteristics may not be combined with other components or characteristics. Also, some constituent components and/or characteristics may be combined to implement the embodiments of the present invention. The order of operations to be disclosed in the embodiments of the present invention may be changed. Some components or characteristics of any embodiment may also be included in other embodiments, or may be replaced with those of the other embodiments as necessary. Moreover, it will be apparent that some claims referring to specific claims may be combined with other claims referring to the other claims other than the specific claims to constitute the embodiment or add new claims by means of amendment after the application is filed.

The above-mentioned embodiments of the present invention are disclosed on the basis of a data communication relationship between a base station and a user equipment. Specific operations to be conducted by the base station in the present invention may also be conducted by an upper node of the base station as necessary. In other words, it will be obvious to those skilled in the art that various operations for enabling the base station to communicate with the user equipment in a network composed of several network nodes including the base station will be conducted by the base station or other network nodes than the base station. The term "Base Station" may be replaced with the terms fixed station, Node-B, eNode-B (eNB), or access point as necessary.

The embodiments of the present invention can be implemented by a variety of means, for example, hardware, firmware, software, or a combination thereof. In the case of implementing the present invention by hardware, the present invention can be implemented through application specific integrated circuits (ASICs), digital signal processors (DSPs), digital signal processing devices (DSPDs), programmable logic devices (PLDs), field programmable gate arrays (FPGAs), a processor, a controller, a microcontroller, a microprocessor, etc.

If operations or functions of the present invention are implemented by firmware or software, the present invention can be implemented in the form of a variety of formats, for example, modules, procedures, functions, etc. The software code may be stored in a memory unit so as to be driven by a processor. The memory unit may be located inside or outside of the processor, so that it can communicate with the aforementioned processor via a variety of well-known parts.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

The present invention is applicable to a wireless communication system. More specifically, the present invention is applicable to a wireless mobile communication apparatus used for a cellular system.

What is claimed is:

1. A method for transmitting a signal to a base station at a user equipment (UE) in a multi-antenna wireless communication system, the method comprising:
mapping interleaver input vector sequences to an interleaver matrix, wherein each of the interleaver input vector sequences comprises vectors having a bit size of $N_L \cdot Q_m$, wherein $Q_m$ is a modulation order and $N_L$ is a number of transmission layers;
reading out the interleaver matrix column by column for obtaining output bit sequences; and
transmitting the output bit sequences through the transmission layers to the base station.

2. The method of claim 1, wherein the interleaver input vector sequences comprise first interleaver input vector sequences for channel quality indicator (CQI) information and data, second interleaver input vector sequences for rank indicator (RI) information, and third interleaver input vector sequences for acknowledgement (ACK)/negative ACK (HACK) information.

3. The method of claim 2, wherein the first interleaver input vector sequences $\underline{g}_0, \underline{g}_1, \underline{g}_2, \underline{g}_3, \ldots, \underline{g}_{H'-1}$ ($H'=H/(Q^p_m \cdot N_L)$ and $H=G+Q_{CQI}$) are generated by concatenating the CQI information $q_0, q_1, q_2, q_3, \ldots, q_{Q_{CQI}-1}$ having a bit size of $Q_{CQI}$ and the data $f_0, f_1, f_2, f_3, \ldots, f_{G-1}$ having a bit size of G and configuring the concatenated CQI information and data as column vectors of the bit size of $N_L \cdot Q_m$.

4. The method of claim 2, wherein each of the second interleaver input vector sequences $\underline{q}'^{RI}_i$ is generated by repeatedly concatenating the RI information $\underline{q}^{RI}_i$ having a bit size of $Q_m$ by $N_L$ times.

5. The method of claim 2, wherein each of the third interleaver input vector sequences $\underline{q}'^{ACK}_i$ is generated by repeatedly concatenating the ACK/NACK information $\underline{q}^{ACK}_i$ having a bit size of $Q_m$ by $N_L$ times.

6. The method of claim 1, wherein each entry of the interleaver matrix is a vector $\underline{y}_k$ having the bit size of $N_L \cdot Q_m$.

7. A user equipment (UE) in a multi-antenna wireless communication system, the UE comprising:
multiple antennas configured to transmit and receive a signal to and from a base station; and
a processor configured to process the signal,
wherein the processor is configured to map interleaver input vector sequences to an interleaver matrix, wherein each of the interleaver input vector sequences comprises vectors having a bit size of $N_L \cdot Q_m$, wherein $Q_m$ is a modulation order and $N_L$ is a number of transmission layers, to read out the interleaver matrix column by column for obtaining output bit sequences and to transmit the output bit sequence through the transmission layers to the base station.

8. The UE of claim 7, wherein the interleaver input vector sequences comprise first interleaver input vector sequences for channel quality indicator (CQI) information and data, second interleaver input vector sequences for rank indicator (RI) information, and third interleaver input vector sequences for acknowledgement (ACK)/negative ACK (HACK) information.

9. The UE of claim 8, wherein the processor generates the first interleaver input vector sequences $\underline{g}_0, \underline{g}_1, \underline{g}_2, \underline{g}_3, \ldots, \underline{g}_{H'-1}$ ($H'=H/(Q^p_m \cdot N_L)$ and $H=G+Q_{CQI}$) by concatenating the CQI information $q_0, q_1, q_2, q_3, \ldots, q_{Q_{CQI}-1}$ having a bit size of $Q_{CQI}$ and the data $f_0, f_1, f_2, f_3, \ldots, f_{G-1}$ having a bit size of G and configuring the concatenated CQI information and data as column vectors of the bit size of $N_L \cdot Q_m$.

10. The UE of claim 8, wherein the processor generates each of the second interleaver input vector sequences $\underline{q}'^{RI}_i$ by repeatedly concatenating the RI information $q^{RI}_i$ having a bit size of $Q_m$ by $N_L$ times.

11. The UE of claim 8, wherein the processor generates each of the third interleaver input vector sequences $\underline{q}'^{ACK}_i$ by repeatedly concatenating the ACK/NACK information $q^{ACK}_i$ having a bit size of $Q_m$ by $N_L$ times.

12. The UE of claim 7, wherein each entry of the interleaver matrix is a vector $\underline{y}_k$ having the bit size of $N_L \cdot Q_m$.

* * * * *